United States Patent
Lux et al.

(10) Patent No.: US 11,736,106 B2
(45) Date of Patent: Aug. 22, 2023

(54) METHOD FOR DETERMINING THE DEFLECTION OF THE ACTUATOR OF A CAPACITIVE MULTIPATH FORCE SENSOR MODULE

(71) Applicant: Leopold Kostal GmbH & Co. KG, Luedenscheid (DE)

(72) Inventors: Marc Lux, Bochum (DE); Matthias Seifert, Bochum (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 375 days.

(21) Appl. No.: 16/914,846

(22) Filed: Jun. 29, 2020

(65) Prior Publication Data

US 2020/0326249 A1    Oct. 15, 2020

Related U.S. Application Data

(63) Continuation of application No. PCT/EP2019/050178, filed on Jan. 4, 2019.

(30) Foreign Application Priority Data

Jan. 8, 2018   (DE) ..................... 10 2018 000 078.9

(51) Int. Cl.
*H03K 17/975* (2006.01)
*G01D 5/24* (2006.01)
*G01L 1/14* (2006.01)

(52) U.S. Cl.
CPC ............. *H03K 17/975* (2013.01); *G01D 5/24* (2013.01); *G01L 1/142* (2013.01)

(58) Field of Classification Search
CPC ...................... G01L 1/142; G01D 5/24; G05G 2009/04762; H03K 2217/960705;
(Continued)

(56) References Cited

U.S. PATENT DOCUMENTS 4,719,420 A * 1/1988 Boimond ............... G21C 17/12
                                                976/DIG. 242
2011/0001549 A1 * 1/2011 Van Gastel .......... H03K 17/962
                                                     327/517
(Continued)

FOREIGN PATENT DOCUMENTS

DE    102014014021 A1 *  3/2016  ............... G05G 1/04
DE    102014014021 A1    3/2016
(Continued)

OTHER PUBLICATIONS

The International Bureau of WIPO, International Preliminary Report on Patentability for International Application No. PCT/EP2019/050178 dated Jul. 14, 2020.
(Continued)

*Primary Examiner* — Alexander Satanovsky
*Assistant Examiner* — Asm Fakhruddin
(74) *Attorney, Agent, or Firm* — Brooks Kushman P.C.

(57) ABSTRACT

A capacitive multipath force sensor module includes a movable actuator, first and second stationary capacitor plates, and a central capacitor plate connected to the actuator and positioned between the stationary plates. The central plate moves by a same amount toward one stationary plate and away from the other stationary plate when the actuator is moved. In multiple successive cycles, while the first stationary plate is held at ground, (i) the central plate and the second stationary plate are connected to a voltage and (ii) are then disconnected from the voltage with the central plate being connected to a capacitor having a known capacitance value to thereby enable a charge quantity stored on the central plate to be transferred to the capacitor. After a predefined number of cycles, a voltage of the capacitor, which is indicative of an amount of movement of the actuator, is measured.

11 Claims, 2 Drawing Sheets

(58) Field of Classification Search
CPC .......... H03K 2217/960725; H03K 2217/9651; H03K 17/975
See application file for complete search history.

(56) References Cited

U.S. PATENT DOCUMENTS

2016/0190958 A1* 6/2016 Gutierrez ................ B81B 7/008
              318/116
2017/0219330 A1   8/2017 Sleeman et al.

FOREIGN PATENT DOCUMENTS

| JP | 2997045 B2 * | 1/2000 | ........... B60G 17/018 |
| KR | 100650851 B1 * | 11/2006 | ........... G01P 3/4802 |
| WO | 2016016612 A1 | 2/2016 | |

OTHER PUBLICATIONS

European Patent Office, International Search Report for International Application No. PCT/EP2019/050178 dated Mar. 13, 2019.

* cited by examiner

METHOD FOR DETERMINING THE DEFLECTION OF THE ACTUATOR OF A CAPACITIVE MULTIPATH FORCE SENSOR MODULE

CROSS-REFERENCE TO RELATED APPLICATIONS

This application is a continuation of International Application No. PCT/EP2019/050178, published in German, with an International filing date of Jan. 4, 2019, which claims priority to DE 10 2018 000 078.9, filed Jan. 8, 2018; the disclosures of which are hereby incorporated in their entirety by reference herein.

TECHNICAL FIELD

The present invention relates to a method for determining the deflection of the actuator of a capacitive multipath force sensor module, the actuator being adjustable from a neutral (rest) position in at least two actuating directions and moves back into the neutral position when an actuating force ceases, the force sensor module further having a central capacitor plate and first and second stationary capacitor plates, the actuator being connected to the central capacitor plate, the central capacitor plate being between the stationary capacitor plates and is at a distance from the stationary capacitor plates when the actuator is in the neutral position, the central capacitor plate being movable toward the first stationary capacitor plate and away from the second stationary capacitor plate by adjusting the actuator in one of the actuating directions, and a measuring capacitor formed by the central capacitor plate together with either the first stationary capacitor plate or the second stationary capacitor plate being used to generate a sensor value that represents the deflection of the actuator.

BACKGROUND

Multipath force sensor modules of this type are utilized, for example, in motor vehicles as universally usable components for forming more or less complex switch systems.

The force sensor modules are preferably designed as two-way or four-way force sensor modules, for example. The force sensor modules are mounted on a shared circuit board that is accommodated in a housing having a user interface with actuating handles that are associated with the force sensor modules.

Multipath force sensor modules that are utilized in such switch systems use capacitive sensors, oppositely situated in pairs, for measuring a force in one axis or two axes. These capacitive sensors are formed in each case by a stationary capacitor plate and an associated capacitor plate that is deflectable by an actuator. Depending on the distance of the deflectable capacitor plate from each of the stationary capacitor plates, specific capacitive measured values result. On the basis of the capacitive measurement results, conclusions may be drawn concerning the deflection, and, via the force-displacement characteristic curve based on the mechanical design, the force that is exerted on the actuator. Since the particular capacitance values are inversely proportional to the distance between the respective capacitor plates, with regard to the oppositely situated capacitors, which "divide" a shared central capacitor plate, a symmetry of their characteristic curves, i.e., a dependency of the measured value on the particular deflection of the actuator, results. For a positive and a negative deflection of the actuator and of the deflectable capacitor plate connected thereto, in each case relative to an axis, an essentially "equal" portion of the characteristic curve, on the one hand based on one stationary capacitor plate and on the other hand based on the other stationary capacitor plate, is therefore always relevant.

SUMMARY

A method for operating a capacitive multipath force sensor module according to embodiments of the present invention provides a particularly cost-effective and reliable option for determining the sought sensor values that represent the particular deflection of the actuator.

According to embodiments of the present invention, this is achieved in that the first stationary capacitor plate is held at a ground potential, and in a continuously applied integration method in multiple successive cycles in each case:—the central capacitor plate and the second stationary capacitor plate are connected to a voltage potential that is different from the ground potential, and are then disconnected from the voltage potential,—a charge quantity stored on the central capacitor plate is transferred to an integration capacitor having a known capacitance value, and after a predefined number of cycles, the voltage then present at the integration capacitor is measured by an A/D converter and is processed to form the first sensor value.

In particular, in applications in which only very small deflections of the actuating lever are desired or permissible, and achieving a certain actuating force is provided as the important criterion for triggering a switching signal, the electrical multipath switch module according to embodiments of the present invention may advantageously be used as a quasi-force-sensitive switch module.

In one preferred embodiment, the central capacitor plate in the rest position of the actuator is situated at essentially the same distance from the first and the second stationary capacitor plate, and the central capacitor plate is moved the same degree toward the first stationary capacitor plate and away from the second stationary capacitor plate by adjusting the actuator.

A method for determining a movement of an actuator of a capacitive multipath force sensor module of an embodiment is provided. In this embodiment, the actuator is movable in at least first and second directions. The capacitive multipath force sensor module further includes a movable capacitor plate and first and second stationary capacitor plates. The movable capacitor plate is connected to the actuator to move with the actuator. The movable capacitor plate is positioned between the stationary capacitor plates and is moved by a same amount toward one of the stationary capacitor plates and away from the other one of the stationary capacitor plates when the actuator is moved in one of the first and second directions. The method includes holding the first stationary capacitor plate at a ground potential. The method further includes in multiple successive cycles in each case, while the first stationary capacitor plate is held at the ground potential, (i) connecting the movable capacitor plate and the second stationary capacitor plate to a first voltage potential that is different from the ground potential and (ii) then disconnecting the movable capacitor plate and the second stationary capacitor plate from the first voltage potential and connecting the movable capacitor plate to an integration capacitor having a known capacitance value to thereby enable a charge quantity stored on the movable capacitor plate to be transferred to the integration capacitor. After a predefined number of cycles, a voltage of the integration capacitor is measured. An amount of movement of the actuator is determined based on the measured voltage of the integration capacitor.

A method for determining a movement of an actuator of a capacitive multipath force sensor module of another embodiment is provided. In this embodiment, the actuator is movable along a first axis in first and second directions and along a second axis in third and fourth directions. The capacitive multipath force sensor module further includes a movable capacitor plate and first and second stationary capacitor plates aligned along the first axis and third and fourth stationary capacitor plates aligned along the second axis. The movable capacitor plate is connected to the actuator to move with the actuator. The movable capacitor plate is moved by a same amount toward one of the first and second stationary capacitor plates and away from the other one of the first and second stationary capacitor plates when the actuator is moved in one of the first and second directions and is moved by a same amount toward one of the third and fourth stationary capacitor plates and away from the other one of the third and fourth stationary capacitor plates when the actuator is moved in one of the third and fourth directions. The method includes holding the first stationary capacitor plate at a ground potential. The method further includes in multiple successive cycles in each case, while the first stationary capacitor plate is held at the ground potential, (i) connecting the movable capacitor plate and the second, third, and fourth stationary capacitor plates to a first voltage potential that is different from the ground potential and (ii) then disconnecting the movable capacitor plate and the second, third, and fourth stationary capacitor plates from the first voltage potential and connecting the movable capacitor plate to an integration capacitor having a known capacitance value to thereby enable a charge quantity stored on the movable capacitor plate to be transferred to the integration capacitor. After a predefined number of cycles, a voltage of the integration capacitor is measured. An amount of movement of the actuator in one of the first and second directions is determined based on the measured voltage of the integration capacitor.

BRIEF DESCRIPTION OF THE DRAWINGS

Embodiments of the present invention are explained below with reference to the appended drawings, which show the following.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
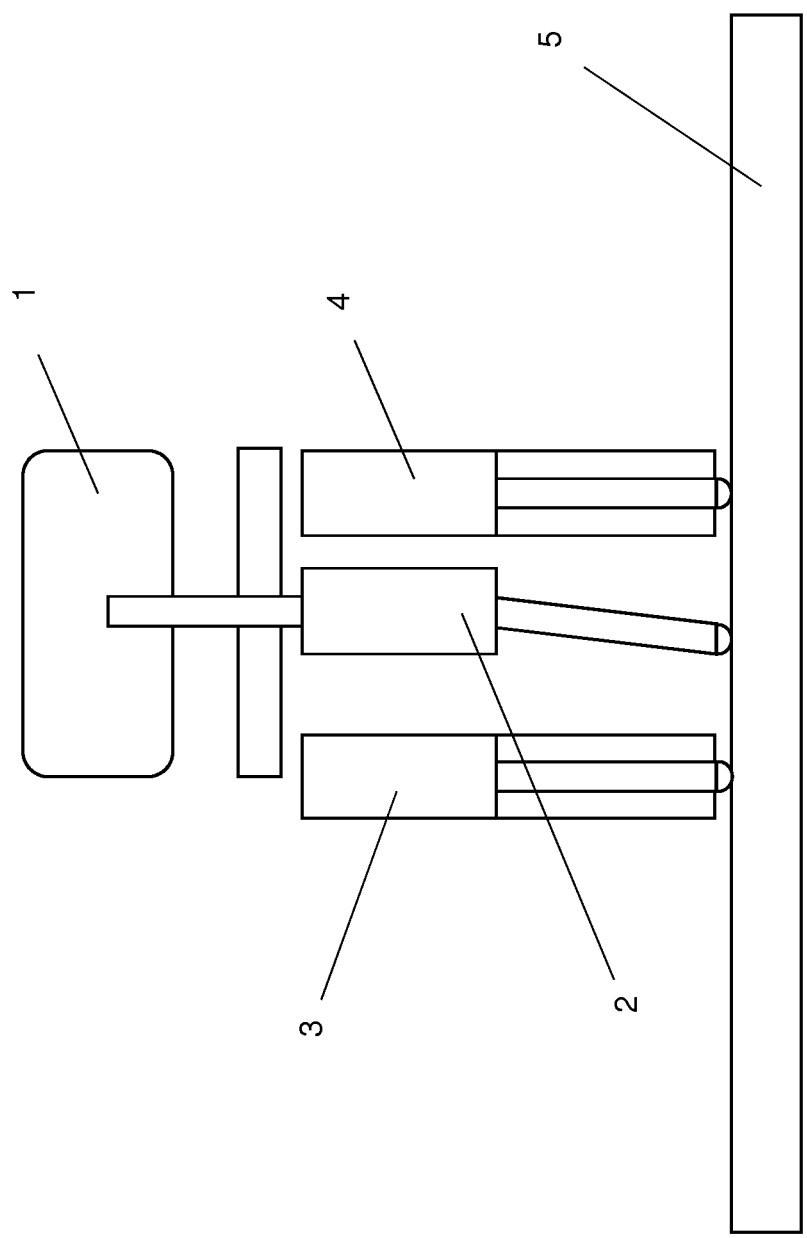
FIG. 1 illustrates a schematic illustration of a capacitive multipath force sensor module that is provided for applying a method according to embodiments of the present invention, the force sensor module having an actuator that is adjustable in two directions along an axis.

Referring now to FIG. 1, an exemplary capacitive multipath force sensor module in accordance with embodiments of the present invention is shown. The force sensor module includes an actuator 1. In the example shown in FIG. 1, actuator 1 is adjustable (i.e., movable, deflectable, etc.) from a neutral (or rest) position along an axis in two directions. Actuator 1 moves back into the neutral position if an actuation force on the actuator ceases.

The force sensor module further includes a central capacitor plate 2. Central capacitor plate 2 is connected to actuator 1 to move with the actuator as the actuator is adjusted. For instance, central capacitor plate 2 moves in the first direction as actuator 1 moves in the first direction; and central capacitor plate 2 moves in the second direction as the actuator moves in the second direction. As such, central capacitor plate 2 is a movable capacitor plate.

The force sensor module further includes two outer stationary capacitor plates 3, 4. Central capacitor plate 2 is positioned between stationary capacitor plates 3, 4.

The force sensor module further includes an electrical printed circuit board (PCB) 5. Capacitor plates 2, 3, and 4 are electrically connected to respective strip conductors of PCB 5. Capacitor plates 2, 3, and 4 are positioned relative to PCB 5 with their main surfaces situated perpendicularly with respect to the PCB. The axis along which actuator 1, and thereby central capacitor plate 2, are adjustable runs parallel to PCB 5 and perpendicular to the main surfaces of capacitor plates 2, 3, 4.

Central capacitor plate 2 in the neutral position of the actuator is at the same distance from first and second stationary capacitor plates 3, 4. Adjusting actuator 1 from the neutral position in one direction causes central capacitor plate 2 to be moved by the same degree toward one of the stationary capacitor plates and away from the other stationary capacitor plate. For instance, as shown in FIG. 1, adjusting actuator 1 in a first one of the two directions causes central capacitor plate 2 to be moved by the same degree toward second stationary capacitor plate 4 and away from first secondary capacitor plate 3. Likewise, adjusting actuator 1 in a second one of the two directions causes central capacitor plate 2 to be moved by the same degree toward first stationary capacitor plate 3 and away from second secondary capacitor plate 4.

Central capacitor plate 2 together with first stationary capacitor plate 3 forms a first measuring capacitor; and central capacitor plate 2 together with second stationary capacitor plate 4 forms a second measuring capacitor. Capacitance values of the two measuring capacitors are used for generating two respective sensor values which represent the deflection (i.e., adjustment, movement, etc.) of actuator 1.

A method according to embodiments of the present invention is applied by firstly holding a first of the two stationary capacitor plates at a ground potential. For instance, first stationary capacitor plate 3 is held at the ground potential. Central capacitor plate 2 and second stationary capacitor plate 4 are then connected to a voltage potential that is different from the ground potential and are subsequently disconnected therefrom. Central capacitor plate 2 is then connected to an integration capacitor (not shown) having a known capacitance value. Thereby, a charge quantity stored on central capacitor plate 2 is transferred to the integration capacitor. Central capacitor plate 2 is connectable to the voltage potential and to the integration capacitor via the strip conductor to which the central capacitor plate 2 is connected. The voltage potential and/or the integration capacitor may be componentry of PCB 5.

Connecting central capacitor plate 2 to the voltage potential causes the central capacitor plate to be charged by the voltage potential. Disconnecting central capacitor plate 2 from the voltage potential and connecting the central capacitor plate to the integration capacitor causes stored charge of the central capacitor plate to be transferred from the central capacitor plate to the integration capacitor.

The steps of (i) connecting central capacitor plate 2 and second stationary capacitor plate 4 to the voltage potential and (ii) disconnecting central capacitor plate 2 and second stationary capacitor plate 4 from the voltage potential and connecting central capacitor plate 2 to the integration capacitor are carried out in multiple successive cycles within the scope of a continuously applied integration method. A charge quantity stored on central capacitor plate 2 is transferred to the integration capacitor while the central capacitor plate is connected to the integration capacitor. First stationary capacitor plate 3 is held at the ground potential during these successive cycles. After a predefined number of cycles, the voltage present at the integration capacitor is measured by an A/D converter and is processed to form a first sensor value that represents the deflection of actuator 1.

The method according to embodiments of the present invention may further include immediately carrying out the same steps again, but with the roles of the two stationary capacitor plates 3, 4 exchanged. That is, first stationary capacitor plate 3 that was previously held at the ground potential is now connected and disconnected with central capacitor plate 2 to/from a voltage potential that is different from the ground potential and second stationary capacitor plate 4 is held at the ground potential. After carrying out the steps of the integration method just described, here as well the voltage that is present at the integration capacitor is measured by an A/D converter after the predefined number of cycles and is processed to form a second sensor value that represents the same deflection of actuator 1.

More descriptively, the method is applied by secondly holding second stationary capacitor plate 4 at the ground potential. Central capacitor plate 2 and first stationary capacitor plate 3 are then connected to a voltage potential that is different from the ground potential and are subsequently disconnected therefrom. Central capacitor plate 2 is then connected to another integration capacitor having a known capacitance value. Thereby, a charge quantity stored on central capacitor plate 2 is transferred to this integration capacitor.

The steps of (i) connecting central capacitor plate 2 and first stationary capacitor plate 3 to the voltage potential and (ii) disconnecting central capacitor plate 2 and first stationary capacitor plate 3 from the voltage potential and connecting central capacitor plate 2 to the integration capacitor are carried out in multiple successive cycles. Second stationary capacitor plate 4 is held at the ground potential during these successive cycles. After a predefined number of cycles, the voltage present at this integration capacitor is measured by an A/D converter and is processed to form a second sensor value that represents the deflection of actuator 1.

The first and second sensor values determined in this way represent the same deflection of actuator 1 with opposite algebraic signs in each case, so that a redundant detection of this deflection is essentially achieved, which may be utilized to increase the reliability.

Figure 2:
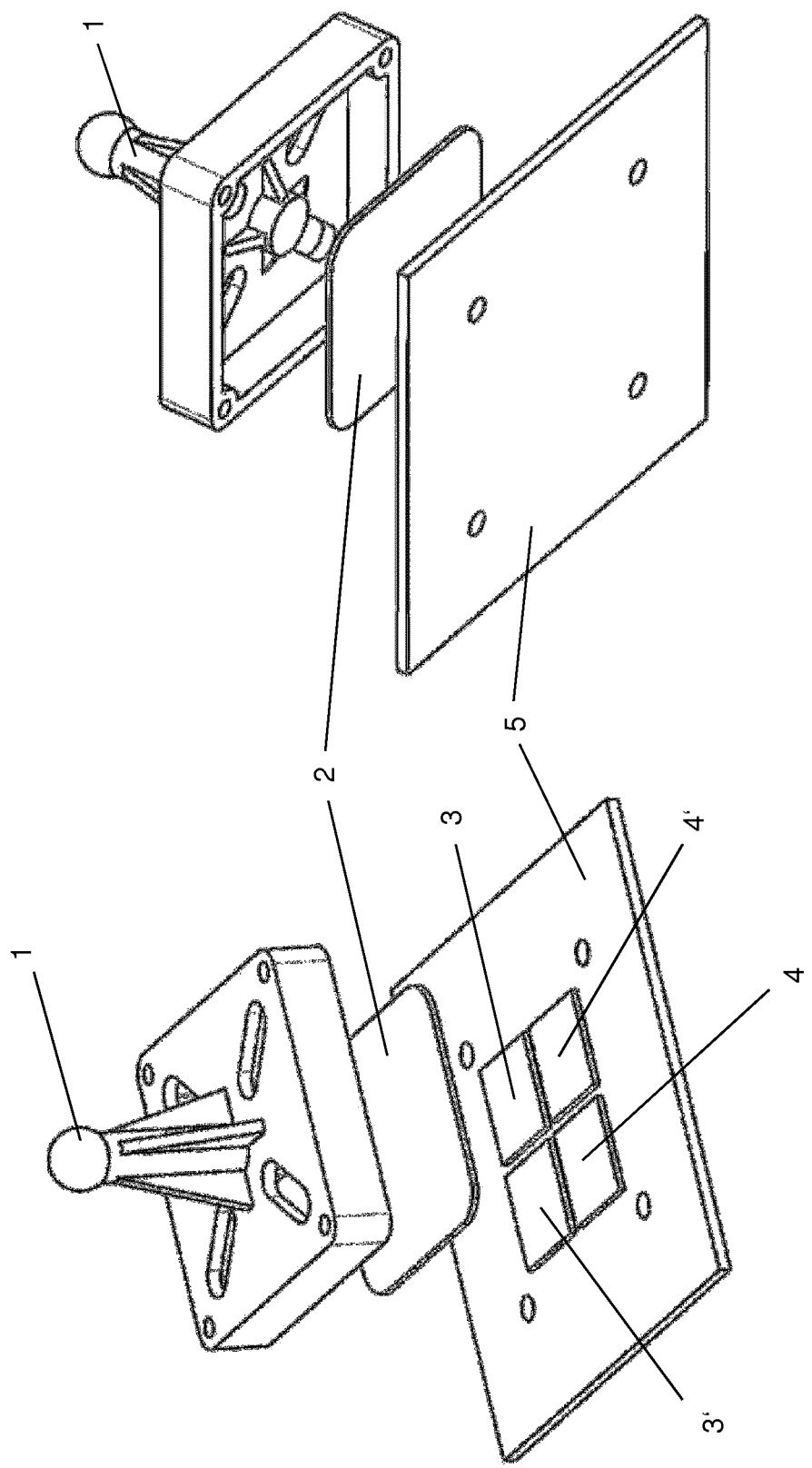
FIG. 2 illustrates a schematic illustration of a capacitive multipath force sensor module that is provided for applying a method according to embodiments of the present invention, the force sensor module having an actuator that is situated so as to be swivelable about two mutually perpendicular axes.

In the example shown in FIG. 2, actuator 1 is situated so as to be swivelable about two mutually perpendicular axes. Central capacitor plate 2 in the rest position of actuator 1 is at the same distance from four of the stationary capacitor plates 3, 3', 4, 4' oppositely situated on PCB 5. Two of these stationary capacitor plates 3, 3', 4, 4' form a first stationary capacitor plate pair 3, 4 that is associated with swiveling of actuator 1 about a first axis, and the other two stationary capacitor plates form a second stationary capacitor plate pair 3', 4' that is associated with swiveling of actuator 1 about the second axis, perpendicular thereto.

Swiveling actuator 1 from the rest position about the first axis causes central capacitor plate 2 to be moved by the same degree toward one of the two outer stationary capacitor plates 4 associated with this swiveling and away from the other stationary capacitor plate 3.

Central capacitor plate 2 together with these two stationary capacitor plates 3, 4 in each case forms measuring capacitors, whose capacitance values are used for generating a sensor value that represents the deflection of actuator 1. With regard to the two other stationary capacitor plates 3', 4' associated with the swiveling about the second axis, the swiveling of actuator 1 about the first axis results in essentially no change.

The method according to embodiments of the present invention is applied as described above with regard to the single-axis design in FIG. 1, in that firstly, a first of the two stationary capacitor plates 3 associated with the swiveling about the first axis is held at a ground potential. Central capacitor plate 2 connected to actuator 1, and in the present case, all three of the remaining stationary capacitor plates 3', 4, 4', are then connected to a voltage potential that is different from the ground potential and are subsequently disconnected therefrom, and a charge quantity that is stored on central capacitor plate 2 is subsequently transferred to an integration capacitor having a known capacitance value.

The further steps of the method are carried out mutatis mutandis as described above with regard to the single-axis design.

In this type of measurement, exactly one stationary capacitor plate is always held at ground potential, and the remaining stationary capacitor plates operate as active shielding, in that they are acted on with the same potential as movable central capacitor plate 2. The capacitor surfaces connected as shielding, due to the potential that is equal to central capacitor plate 2 for the described capacitive measurement, are essentially "invisible," and therefore do not contribute significantly to the capacitive distance measurement.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A method for determining a movement of an actuator of a capacitive multipath force sensor module, the actuator being movable from a neutral position in first and second directions, the capacitive multipath force sensor module further including a movable capacitor plate and first and second stationary capacitor plates, the movable capacitor plate being connected to the actuator to move with the actuator, wherein the movable capacitor plate is positioned between the stationary capacitor plates and is moved by a same amount toward one of the stationary capacitor plates and away from the other one of the stationary capacitor plates when the actuator is moved in one of the first and second directions, the method comprising:
- holding the first stationary capacitor plate at a ground potential;
- in multiple successive cycles in each case, while the first stationary capacitor plate is held at the ground potential, (i) connecting the movable capacitor plate and the second stationary capacitor plate to a first voltage potential that is different from the ground potential and (ii) then disconnecting the movable capacitor plate and the second stationary capacitor plate from the first voltage potential and connecting the movable capacitor plate to an integration capacitor having a known capacitance value to thereby enable a charge quantity stored on the movable capacitor plate to be transferred to the integration capacitor;
- after a predefined number of cycles, measuring a voltage of the integration capacitor; and
- determining an amount of movement of the actuator based on the measured voltage of the integration capacitor.

2. The method of claim 1 further comprising:
- holding the second stationary capacitor plate at the ground potential;
- in multiple successive second cycles in each case, while the second stationary capacitor plate is held at the ground potential, (i) connecting the movable capacitor plate and the first stationary capacitor plate to a second voltage potential that is different from the ground potential and (ii) then disconnecting the movable capacitor plate and the first stationary capacitor plate from the second voltage potential and connecting the movable capacitor plate to the integration capacitor to thereby enable a charge quantity stored on the movable capacitor plate to be transferred to the integration capacitor;
- after a predefined number of second cycles, measuring a second voltage of the integration capacitor;
- determining the amount of movement of the actuator based on the measured second voltage of the integration capacitor; and
- verifying that the amount of movement of the actuator based on the measured voltages of the integration capacitor is the same so that a redundant detection of the amount of movement of the actuator is achieved.

3. The method of claim 1 wherein the movable capacitor plate is at a same distance from the first and second stationary capacitor plates when the actuator is in the neutral position.

4. The method of claim 1 wherein the capacitive multipath force sensor module further includes a printed circuit board (PCB) and the movable capacitor plate and the first and second stationary capacitor plates are electrically connected to respective strip conductors of the PCB.

5. The method of claim 1 wherein a first measuring capacitor is formed by the movable capacitor plate and the first stationary capacitor plate, the method further comprising:
- using the first measuring capacitor to generate a first sensor value that represents the amount of movement of the actuator.

6. The method of claim 1 wherein a second measuring capacitor is formed by the movable capacitor plate and the second stationary capacitor plate, the method further comprising:
- using the second measuring capacitor to generate a second sensor value that represents the amount of movement of the actuator.

7. The method of claim 1 wherein the actuator is movable about two mutually perpendicular axes in four actuating directions.

8. A method for determining a movement of an actuator of a capacitive multipath force sensor module, the actuator being movable from a neutral position along a first axis in first and second directions and along a second axis in third and fourth directions, the capacitive multipath force sensor module further including a movable capacitor plate and first and second stationary capacitor plates aligned along the first axis and third and fourth stationary capacitor plates aligned along the second axis, the movable capacitor plate being connected to the actuator to move with the actuator, wherein the movable capacitor plate is moved by a same amount toward one of the first and second stationary capacitor plates and away from the other one of the first and second stationary capacitor plates when the actuator is moved in one of the first and second directions and is moved by a same amount toward one of the third and fourth stationary capacitor plates and away from the other one of the third and fourth stationary capacitor plates when the actuator is moved in one of the third and fourth directions, the method comprising:
- holding the first stationary capacitor plate at a ground potential;
- in multiple successive cycles in each case, while the first stationary capacitor plate is held at the ground potential, (i) connecting the movable capacitor plate and the second, third, and fourth stationary capacitor plates to a first voltage potential that is different from the ground potential and (ii) then disconnecting the movable capacitor plate and the second, third, and fourth stationary capacitor plates from the first voltage potential and connecting the movable capacitor plate to an integration capacitor having a known capacitance value to thereby enable a charge quantity stored on the movable capacitor plate to be transferred to the integration capacitor;
- after a predefined number of cycles, measuring a voltage of the integration capacitor; and
- determining an amount of movement of the actuator in one of the first and second directions based on the measured voltage of the integration capacitor.

9. The method of claim 8 further comprising:
- holding the second stationary capacitor plate at the ground potential;
- in multiple successive second cycles in each case, while the second stationary capacitor plate is held at the ground potential, (i) connecting the movable capacitor plate and the first, third, and fourth stationary capacitor plates to a second voltage potential that is different from the ground potential and (ii) then disconnecting the movable capacitor plate and the first, third, and fourth stationary capacitor plates from the second voltage potential and connecting the movable capacitor plate to the integration capacitor to thereby enable a charge quantity stored on the movable capacitor plate to be transferred to the integration capacitor;
- after a predefined number of second cycles, measuring a second voltage of the integration capacitor;
- determining an amount of movement of the actuator in the one of the first and second directions based on the measured second voltage of the integration capacitor; and verifying that the amount of movement of the actuator based on the measured voltages of the integration capacitor is the same so that a redundant detection of the amount of movement of the actuator in the one of the first and second directions is achieved.

10. The method of claim 8 further comprising:

holding the third stationary capacitor plate at the ground potential;

in multiple successive third cycles in each case, while the third stationary capacitor plate is held at the ground potential, (i) connecting the movable capacitor plate and the first, second, and fourth stationary capacitor plates to a third voltage potential that is different from the ground potential and (ii) then disconnecting the movable capacitor plate and the first, second, and fourth stationary capacitor plates from the third voltage potential and connecting the movable capacitor plate to the integration capacitor to thereby enable a charge quantity stored on the movable capacitor plate to be transferred to the integration capacitor;

after a predefined number of third cycles, measuring a third voltage of the integration capacitor; and determining an amount of movement of the actuator in one of the third and fourth directions based on the measured third voltage of the integration capacitor.

11. The method of claim 10 further comprising:

holding the fourth stationary capacitor plate at the ground potential;

in multiple successive fourth cycles in each case, while the fourth stationary capacitor plate is held at the ground potential, (i) connecting the movable capacitor plate and the first, second, and third stationary capacitor plates to a fourth voltage potential that is different from the ground potential and (ii) then disconnecting the movable capacitor plate and the first, second, and third stationary capacitor plates from the fourth voltage potential and connecting the movable capacitor plate to the integration capacitor to thereby enable a charge quantity stored on the movable capacitor plate to be transferred to the integration capacitor;

after a predefined number of fourth cycles, measuring a fourth voltage of the integration capacitor;

determining an amount of movement of the actuator in the one of the third and fourth directions based on the measured fourth voltage of the integration capacitor; and verifying that the amount of movement of the actuator based on the measured third voltage of the integration capacitor and the amount of movement of the actuator based on the measured fourth voltage of the integration capacitor are the same so that a redundant detection of the amount of movement of the actuator in the one of the third and fourth directions is achieved.

\* \* \* \* \*